United States Patent
Lips et al.

(10) Patent No.: US 11,243,279 B2
(45) Date of Patent: Feb. 8, 2022

(54) RADIO FREQUENCY (RF) ANTENNA ELEMENT WITH A (DE) TUNING SYSTEM

(71) Applicant: KONINKLIJKE PHILIPS N.V., Eindhoven (NL)

(72) Inventors: Oliver Lips, Hamburg (DE); Martinus Bernardus Van Der Mark, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/042,276

(22) PCT Filed: Mar. 26, 2019

(86) PCT No.: PCT/EP2019/057478
§ 371 (c)(1),
(2) Date: Sep. 28, 2020

(87) PCT Pub. No.: WO2019/185564
PCT Pub. Date: Oct. 3, 2019

(65) Prior Publication Data
US 2021/0055363 A1  Feb. 25, 2021

(30) Foreign Application Priority Data
Mar. 29, 2018 (EP) .................... 18164932

(51) Int. Cl.
*G01R 33/36* (2006.01)
(52) U.S. Cl.
CPC ..... *G01R 33/3628* (2013.01); *G01R 33/3642* (2013.01); *G01R 33/3664* (2013.01)

(58) Field of Classification Search
CPC ........... G01R 33/3628; G01R 33/3642; G01R 33/3664; G01R 33/3692; G01R 33/3657
See application file for complete search history.

(56) References Cited

U.S. PATENT DOCUMENTS

| 5,545,999 A | 8/1996 | Mueller et al. |
| 5,869,966 A | 2/1999 | Gatehouse |
| 6,144,205 A | 11/2000 | Souza et al. |
| 10,481,228 B2 | 11/2019 | Van Helvoort |
| 2004/0019273 A1 | 1/2004 | Helfer et al. |
| 2007/0164746 A1* | 7/2007 | Jevtic ................. G01R 33/3692 324/322 |

(Continued)

FOREIGN PATENT DOCUMENTS

| JP | 03103232 A | 4/1991 |
| JP | 2807281 B2 | 10/1998 |

OTHER PUBLICATIONS

Korn et al "Optically Detunable Inductively Coupled Coil for Self-Gating in Small Animal Magnetic Resonance Imaging" MRM 65 (2011)p. 882-888.

(Continued)

*Primary Examiner* — Rishi R Patel

(57) ABSTRACT

A radio frequency (RF) antenna element with a (de)tuning system, with the RF antenna element having a resonant electrically conductive loop and a (de)tuning system including a photosensitive switching element to (de)tune the resonant electrically conductive loop. The (de)tuning system comprises an injection optical source optically coupled to the photosensitive switching element.

4 Claims, 2 Drawing Sheets

(56) References Cited

U.S. PATENT DOCUMENTS

2008/0146907 A1    6/2008    Koste
2010/0039113 A1    2/2010    Vartiovaara

OTHER PUBLICATIONS

International Search Report and Written Opinion from PCT/EP2019/057478 dated Jul. 3, 2019.
R. Ayde et al "Active Optical Based Decoupling Circuit for Receiver Endoluminal Coil" Proceedings of the International Soc. for Magnetic Resonance in Med. No. 1343 Apr. 28, 2014.
E. W. Jacobs, D. W. Fogliatti, H. Nguyen, D. J. Albares, C. T. Chang and C. K. Sun, "Photo-injection p-i-n diode switch for high-power RF switching," in IEEE Transactions on Microwave Theory and Techniques, vol. 50, No. 2, pp. 413-419, Feb. 2002.

* cited by examiner

RADIO FREQUENCY (RF) ANTENNA ELEMENT WITH A (DE) TUNING SYSTEM

CROSS REFERENCE TO RELATED APPLICATIONS

This application is a U.S. national phase application of International Application No. PCT/EP2019/057478 filed on Mar. 26, 2019, which claims the benefit of EP Application Serial No. 18164932.8 filed on Mar. 29, 2018 and is incorporated herein by reference.

FIELD OF THE INVENTION

Magnetic resonance imaging (MRI) methods utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MRI method in general, the body of the patient to be examined is arranged in a strong, uniform magnetic field $B_0$ whose direction at the same time defines an axis (normally the z-axis) of the co-ordinate system to which the measurement is related. The magnetic field $B_0$ causes different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field Bi of this RF pulse extends perpendicular to the z-axis, so that the magnetization performs a precession motion about the z-axis. The precession motion describes a surface of a cone whose angle of aperture is referred to as flip angle. The magnitude of the flip angle is dependent on the strength and the duration of the applied electromagnetic pulse. In the example of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z-direction relaxes with a second and shorter time constant $T_2$ (spin-spin or transverse relaxation time). The transverse magnetization and its variation can be detected by means of receiving RF antennae (coil arrays) which are arranged and oriented within an examination volume of the magnetic resonance examination system in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the subject being imaged, such as a patient to be examined, magnetic field gradients extending along the three main axes are superposed on the uniform magnetic field $B_0$, leading to a linear spatial dependency of the spin resonance frequency. The signal picked up in the receiving antennae (coil arrays) then contains components of different frequencies which can be associated with different locations in the body. The signal data obtained via the receiving coils correspond to the spatial frequency domain of the wave-vectors of the magnetic resonance signal and are called k-space data. The k-space data usually include multiple lines acquired of different phase encoding. Each line is digitized by collecting a number of samples. A set of k-space data is converted to an MR image by means of Fourier transformation.

The transverse magnetization dephases also in presence of magnetic field gradients. This process can be reversed, similar to the formation of RF induced (spin) echoes, by appropriate gradient reversal forming a so-called gradient echo. However, in case of a gradient echo, effects of main field inhomogeneities, chemical shift and other off-resonances effects are not refocused, in contrast to the RF refocused (spin) echo.

The invention pertains to a radio frequency (RF) antenna element for a magnetic resonance examination system with a (de)tuning system. Notably the (de)tuning system is arranged for optically detuning the RF antenna element. The radio frequency (RF) antenna element with the (de)tuning system is for use with an magnetic resonance examination system to pick-up magnetic resonance signals. The (de) tuning system functions to detune the RF antenna element during transmission of RF excitation fields in the magnetic resonance examination system and to tune the RF antenna element to be resonant during pick-up of the magnetic resonance signals.

BACKGROUND OF THE INVENTION

The paper '*Optically detunable, inductively coupled coil for self-gating in small animal magnetic resonance imaging*', by M. Korn et al. in MRM65(2011)882-888, discloses a radio frequency (RF) antenna element with a (de)tuning system arranged to optically detuning the RF antenna element. The known RF antenna element is formed by a single loop coil of a small resonant surface coil that can be dynamically be detuned by a capacitor shunted with two pin-diodes connected to a photodiode. Under illumination, the photocurrent of the photodiodes switches the pin-diodes into the conducting state, detuning the surface coil.

SUMMARY OF THE INVENTION

An object of the present invention is to provide a radio frequency (RF) antenna element with a (de)tuning system having an improved noise-characteristic.

This object is achieved by the a radio frequency (RF) antenna element with a (de)tuning system wherein
the RF antenna element comprises a resonant electrically conductive loop and a (de)tuning system including a photosensitive switching element to (de)tune the resonant electrically conductive loop and
the (de)tuning system comprises an injection optical source optically coupled to the photosensitive switching element.

The (de)tuning system functions to tune the RF antenna element to resonance in the Larmor frequency band or to detune to RF antenna element be non-resonant in the Larmor frequency band. The (de)tuning system comprises a switching element to switch the (de)tuning system between tuning and detuning That is, the switching element being in its open or closed (electrically non-conducting or electrically conducting) corresponds to detuning or tuning of the RF antenna element (or vice versa). In practice the RF antenna element is detuned for receiving magnetic resonance signals when a strong RF-field is applied e.g. to excite, invert or refocus spins. In this way the RF antenna element and its sensitive electronics are protected from such strong RF field. When no strong RF field is applied, the RF antenna element is made resonant in the Larmor frequency band and is sensitive to receive very weak magnetic resonance signals, e.g. due to the earlier RF excitation. According to the invention, the injection optical source is optically coupled to the photosensitive switching element. The photosensitive switching element is closed when photons from the injection optical source are incident and the photosensitive switching element is open when no photons are incident. A simple inexpensive implementation is to employ a (pin) photodiode as the photosensitive switching element. By (direct) injection of photons the photosensitive switching element is changed from its open state to its closed state and ceasing the injection of photons changes the photosensitive switching element from its closed state back to its open state. By injection of photons from the injection optical source into the photosensitive switching element, mobile electrical charge carriers are generated in the photosensitive switching element so that the photosensitive switching element becomes electrically conducting. The switching element is open when no photons are incident on the photosensitive switching element, e.g. when the injection optical source is switched off. That is, by switching on/off of the injection of photons from the injection optical source into the photosensitive switching element, the photosensitive switching element is closed/opened and as a consequence the RF antenna element is switching between its (non)-resonant states. Correspondingly, by switching on/off of the injection optical source the RF antenna element is switched between its (non)-resonant states. The (direct) injection of photons into the photosensitive switching elements does not need a separate photovoltaic element to generate electrical charge carriers to render the photosensitive switching element electrically conducting.

These and other aspects of the invention will be further elaborated with reference to the embodiments defined in the dependent Claims.

In an embodiment of the invention the (de)tuning system includes a photodetector in parallel with the photosensitive switching element and a bias optical source optically coupled to the photodetector. The photodetector generates a negative bias voltage over the photosensitive switching element in response to incident radiation from the bias optical source. When no photons from the injection light source are injected into the photosensitive switching element, then the photodetector is illuminated by radiation from the bias optical source and a negative bias (photo) voltage is generated in the photodiode and applied over the photosensitive switching element. Consequently, the electrical resistance of the switching element is increased in the open state and the switching element electrically behaves like a capacitor rather than a resistive conductor. This reduces (thermal) noise generated in the RF antenna element so that the signal-to-noise of the received magnetic resonance signals is increased. In the closed state of the switch, no radiation from the bias optical source is incident on the photodetector and then no negative bias voltage is generated and the photosensitive switching element has low resistance. This may be achieved by e.g. controlling the bias optical source and the injection optical source such that the bias optical source is switched on when the injection optical source is switched off, while the bias optical source is switched off when the injection optical source is switched on and the photosensitive switching element closed.

In another embodiment of the invention an electrical interface circuit is provided with one or more inductances in series with the photosensitive switching element and a resistor in parallel to the photodetector for the bias optical source. The inductances act as a filter to attenuate or even block radio frequency signals from the (de)tuning system. The resistance adds to reduce transient signals due to switching of the photosensitive switching element. Thus, the electrical interface circuit provides for low RF interference with the acquisition of the magnetic resonance signals and also reduces dead time of the acquisition of the magnetic resonance signals. Inductances tend to be large in size, so it is often more convenient two place two of them at different positions, sometimes also a more symmetric setup is advantageous.

For example the photosensitive switching element is formed by back-to-back photodiodes. The back-to-back diodes achieve that they cannot be turned to conducting by the RF signal that is to be blocked, i.e. for which the RF antenna element is set to its non-resonant state. A single photodiode might be turned on during the positive half-cycle of the RF signal, if this is larger than the required forward voltage (added to the negative bias voltage). of the single photodiode diode.

In a further embodiment the injection optical source and the bias optical source may make use of the common optical source arranged with an optical switching system to couple the common optical source to photodetector and to the photosensitive switching element.

These and other aspects of the invention will be elucidated with reference to the embodiments described hereinafter and with reference to the accompanying drawing wherein

DETAILED DESCRIPTION OF THE EMBODIMENTS

Figure 1:
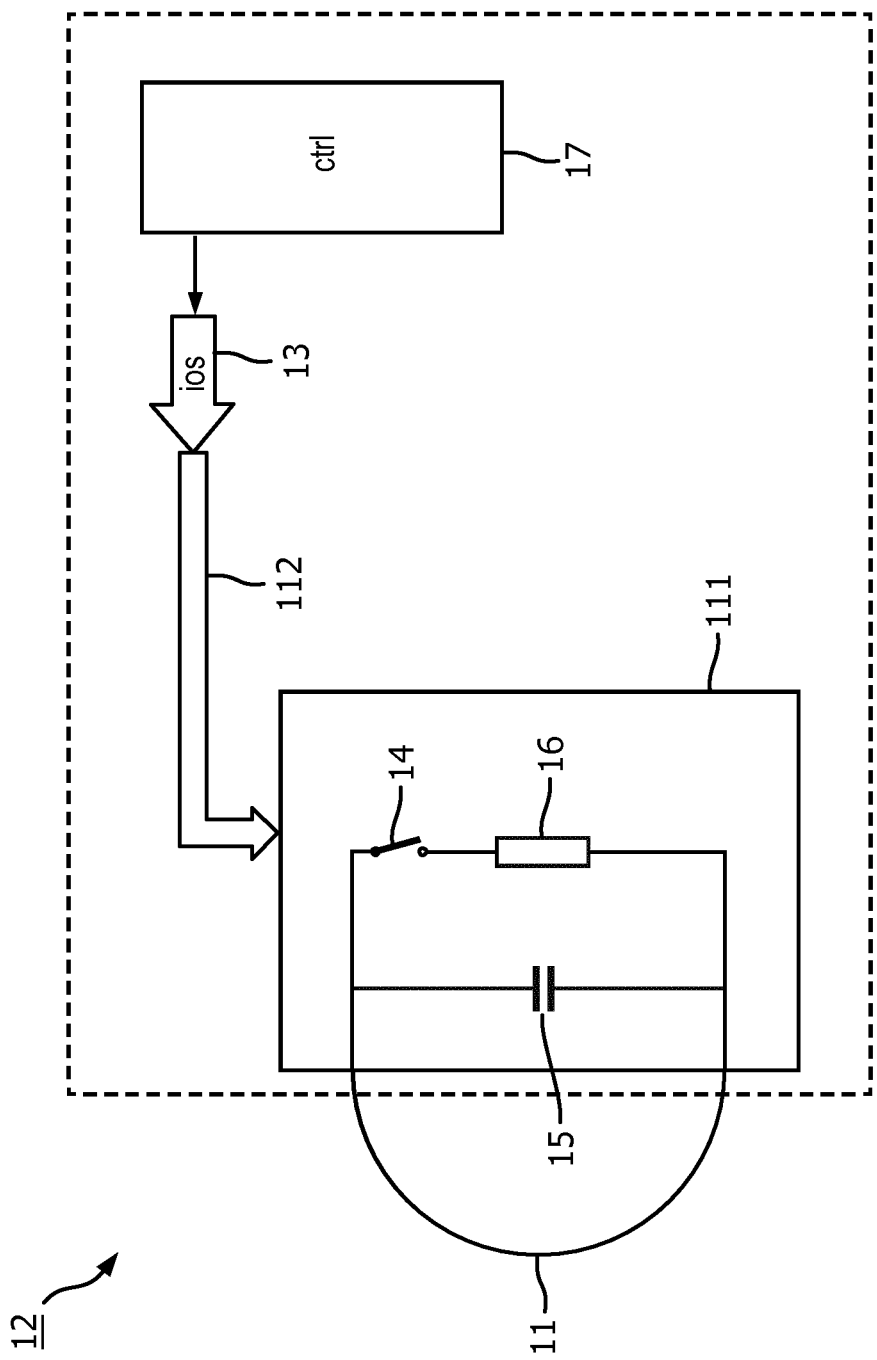
FIG. 1 shows a schematic representation of an embodiment of a radio frequency (RF) antenna element with a (de)tuning system of the invention.

FIG. 1 shows a schematic representation of an embodiment of a radio frequency (RF) antenna element with a (de)tuning system of the invention. The radio frequency antenna element is formed as an electrically conductive coil loop 11. The (de)tuning system 12 includes a switchable resonance circuit 111 coupled to the coil loop 11. The switchable resonant circuit includes a capacitance 15 in series with the coil loop 11 and an inductance 16 that is switchable, by the photosensitive switching element 14, in parallel to the capacitance 15 and in series with the inductance 16. By opening/closing the photosensitive switching element (i.e. changing its character between capacitive and resistive) the electrically conductive loop is switched between its non-resonant state and its resonant state. To close the photosensitive switching element, photon from the injection light source 13 are injected via the optical link 112 into the photosensitive switching element. When no photons from the injection light source are incident on the photosensitive switching element, the photosensitive switching element is in its open state. A (de)tune controller 17 is provided to control the injection optical source 17. The switching of the injection light source causes the (de)tuning system to switch the coil loop between its resonant and non-resonant state.

The photosensitive switching element may be a simple pin-(photo)diode or alternatively back-to-back circuited pin-(photo)diodes may be used.

Figure 2:
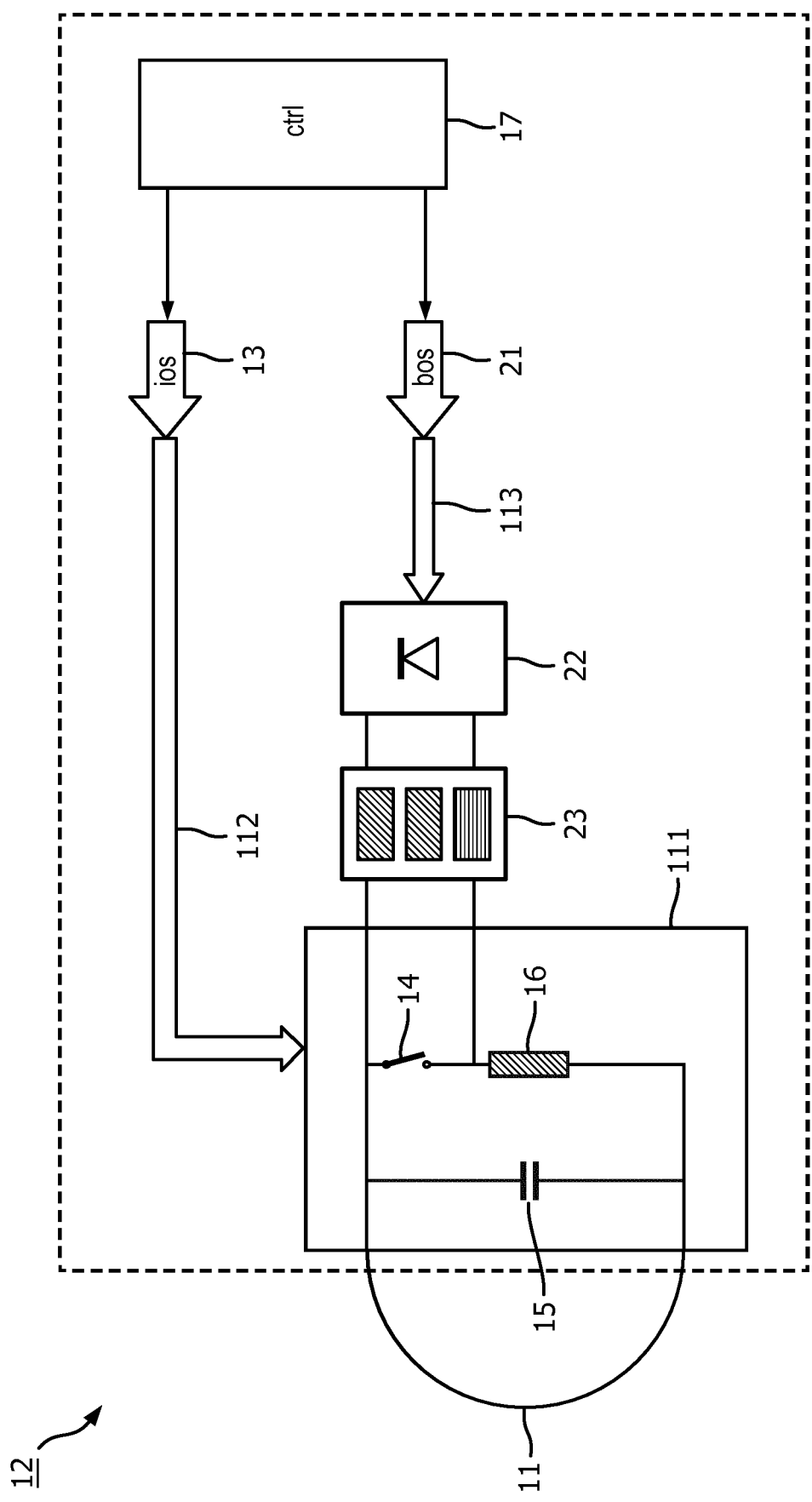
FIG. 2 shows a schematic representation of a further embodiment of a radio frequency (RF) antenna element with a (de)tuning system of the invention.

FIG. 2 shows a schematic representation of a further embodiment of a radio frequency (RF) antenna element with a (de)tuning system of the invention. In the embodiment of FIG. 2 a photodetector 22 is circuited parallel to the photosensitive switching element 14. The bias optical source 21 is optically coupled 113 to the photodetector. The bias optical source is switched-on/off by the (de)tune controller. When photons from the bias optical source 21 are incident on the photodetector 22, then the photodetector 22 generates a negative bias voltage applied over the photosensitive switching element. The bias optical source is activated when the injection optical source is switched off. The negative bias voltage is applied over the photosensitive element when the photosensitive element is in its open state.

Instead of switching-off of the injection optical source and the bias optical source, the optical links 112,113 might be interrupted.

The photodetector may be a GaN-based semiconductor laser or a InGaN blue LED which may generate up to 75V negative bias voltage.

The invention claimed is:

1. A radio frequency (RF) antenna element for magnetic resonance imaging (MRI), wherein
the RF antenna element comprises a resonant electrically conductive loop and a detuning system comprising a photosensitive switching element configured to detune the resonant electrically conductive loop, wherein the detuning system comprises;
an injection optical source optically coupled to the photosensitive switching element;
a photodetector in parallel with the photosensitive switching element; and
a bias optical source optically coupled to the photodetector, wherein the photodetector is configured to generate a negative bias voltage over the photosensitive switching element in response to incident radiation from the bias optical source.

2. The radio frequency (RF) antenna element of claim 1, further comprising an electrical interface circuit with at least one inductance in series with the photosensitive switching element and a resistor in parallel to the photodetector.

3. The radio frequency (RF) antenna element of claim 1, wherein the photosensitive switching element is formed by back-to-back circuited photodiodes.

4. The radio frequency (RF) antenna element of claim 1, wherein the injection optical source and the bias optical source are formed by a common optical source with an optically switching system configured to independently optically couple the common optical source to the injection optical source and to the bias optical source, respectively.

* * * * *